(12) United States Patent
Menkus et al.

(10) Patent No.: US 11,716,090 B2
(45) Date of Patent: Aug. 1, 2023

(54) INTERLEAVED ANALOG-TO-DIGITAL CONVERTER (ADC) GAIN CALIBRATION

(71) Applicant: AyDeeKay LLC, Aliso Viejo, CA (US)

(72) Inventors: Christopher A. Menkus, Aliso Viejo, CA (US); Robert W. Kim, Aliso Viejo, CA (US)

(73) Assignee: AyDee Kay LLC, Aliso Viejo, CA (US)

( * ) Notice: Subject to any disclaimer, the term of this patent is extended or adjusted under 35 U.S.C. 154(b) by 0 days.

(21) Appl. No.: 17/870,831

(22) Filed: Jul. 22, 2022

(65) Prior Publication Data

US 2023/0013568 A1  Jan. 19, 2023

Related U.S. Application Data

(63) Continuation of application No. 17/322,876, filed on May 17, 2021, now Pat. No. 11,424,752.

(Continued)

(51) Int. Cl.
  *H03M 1/06* (2006.01)

(52) U.S. Cl.
  CPC ....... *H03M 1/0609* (2013.01); *H03M 1/0612* (2013.01)

(58) Field of Classification Search
  CPC .. H03M 1/1215; H03M 1/466; H03M 1/1245; H03M 1/468; H03M 1/1061; H03M 1/1019; H03M 1/0678; H03M 1/0863; H03M 1/1009; H03M 1/1023; H03M 1/1057; H03M 1/34; H03M 1/361;

(Continued)

(56) References Cited

U.S. PATENT DOCUMENTS 6,331,830 B1  12/2001  Song
7,088,281 B1  8/2006  Menkus
(Continued)

FOREIGN PATENT DOCUMENTS

CN  110971235 A  4/2020
KR  101774522 B1  9/2017

OTHER PUBLICATIONS

International Search Report and Written Opinion, PCT application serial No. PCT/US21/58003, dated Jan. 31, 2022.

*Primary Examiner* — Linh V Nguyen
(74) *Attorney, Agent, or Firm* — Steven Stupp

(57) ABSTRACT

An integrated circuit may include a full-scale reference generation circuit that corrects for variation in the gain or full scale of a set of interleaved analog-to-digital converters (ADCs). Notably, the full-scale reference generation circuit may provide a given full-scale or reference setting for a given interleaved ADC, where the given full-scale setting corresponds to a predefined or fixed component and a variable component (which may specify a given full-scale correction for a given full scale). For example, the full-scale reference generation circuit may include a full-scale reference generator replica circuit that outputs a fixed current corresponding to the fixed component. Furthermore, the full-scale reference generation circuit may include a full-scale reference generator circuit that outputs a first voltage corresponding to the given full-scale setting based at least in part on the fixed current and a variable current that, at least in part, specifies the given full-scale correction.

20 Claims, 5 Drawing Sheets

Related U.S. Application Data

(60) Provisional application No. 63/110,895, filed on Nov. 6, 2020.

(58) Field of Classification Search
CPC .......... H03M 1/46; H03M 1/66; H03M 1/742; H03M 3/464; H03M 1/1033; H03M 1/121; H03M 1/1295; H03M 1/366; H03M 1/687; H03M 3/384; H03M 3/388; H03M 3/434
USPC ................. 341/118–121, 141, 142, 144, 155
See application file for complete search history.

(56) References Cited

U.S. PATENT DOCUMENTS

| | | |
|---|---|---|
| 9,100,034 B2 | 8/2015 | Oshima |
| 9,143,149 B1* | 9/2015 | van Engelen ....... H03M 1/1215 |
| 9,154,146 B1 | 10/2015 | Chiu |
| 9,191,025 B1* | 11/2015 | Chopra ................. H03M 1/462 |
| 9,621,179 B1* | 4/2017 | Maulik ................ H03M 1/0863 |
| 9,866,227 B1 | 1/2018 | Bresciani |
| 10,020,814 B2 | 7/2018 | Kimura |
| 10,826,513 B1 | 11/2020 | Yang |
| 2003/0231130 A1 | 12/2003 | Canfalonieri |
| 2009/0146854 A1 | 6/2009 | Kawahito |
| 2010/0085231 A1* | 4/2010 | Doris ................... H03M 1/188 341/155 |
| 2012/0001781 A1 | 1/2012 | Scanlan |
| 2013/0176154 A1* | 7/2013 | Bonaccio ............. H03M 1/182 341/118 |
| 2015/0138007 A1 | 5/2015 | Shiraishi |
| 2015/0207518 A1 | 7/2015 | Liu |
| 2016/0126970 A1* | 5/2016 | Xu ....................... H03M 1/1245 341/120 |
| 2018/0026781 A1* | 1/2018 | Otte ......................... H04L 7/02 375/355 |
| 2020/0067521 A1* | 2/2020 | Hervé ................... H03M 3/384 |
| 2021/0255650 A1* | 8/2021 | Tschirhart ................ H02J 1/14 |

* cited by examiner

INTERLEAVED ANALOG-TO-DIGITAL CONVERTER (ADC) GAIN CALIBRATION

CROSS REFERENCE TO RELATED APPLICATIONS

This application is a continuation of U.S. Nonprovisional Application Ser. No. 17/322,876, entitled "Interleaved Analog-to-Digital Converter (ADC) Gain Calibration," by Christopher A. Menkus, et al., filed on May 17, 2021, which claims priority under 35 U.S.C. 119(e) to U.S. Provisional Application Ser. No. 63/110,895, entitled "Interleaved Analog-to-Digital Converter (ADC) Gain Calibration," by Christopher A. Menkus, et al., filed on Nov. 6, 2020, the contents of both of which are herein incorporated by reference.

FIELD

The present disclosure relates to an integrated circuit or a system that provides gain or full-scale calibration of at least an analog-to-digital converter (ADC). Notably, the present disclosure relates to an integrated circuit or a system that determines settings that specify full scales of a set of interleaved ADCs.

BACKGROUND

An ADC is a widely used circuit component for converting an analog signal into a quantized or digital representation. Typically, an integrated circuit may include multiple ADCs.

One approach to implementing analog-to-digital conversion is a time-interleaved ADC. In this type of ADC, multiple ADCs (such as N ADCs, where N is an integer) are operated in parallel, where a given ADC samples the analog signal every $N^{th}$ cycle of a sampling clock. Consequently, the effective sampling rate may be increased N times relative to the sampling rate of each individual ADC.

However, in practice it can be difficult to achieve full resolution at the effective sampling rate in a time-interleaved ADC. Notably, ADCs are often sensitive to mismatch, process, voltage and/or temperature variations. For example, these effects can modify or change the gain or full scale of a given ADC and/or may result in a DC offset. In turn, the different gains or full scales and/or DC offsets result in differences between the individual ADCs in the N ADCs, which can degrade the overall performance and the dynamic range of the time-interleaved ADC.

Some ADCs attempt to address mismatch errors using digital post-processing. Notably, mismatch errors may be sensed using averaging and the full scales of ADCs may be adjusted using digital multiplication of adjustable coefficients. However, this approach may amplify noise.

Another technique for addressing mismatch errors uses a common (or shared) full-scale reference for multiple ADCs. However, this approach may not account for non-reference-related mismatch, such as mismatch in the front-end track and hold circuit in an ADC. Moreover, the use of a common full-scale reference allows noise to be coupled within or among the ADCs in an array. Consequently, there remains a need to correct mismatch errors in a time-interleaved ADC.

SUMMARY

Embodiments of an integrated circuit are described. This integrated circuit includes: a set of interleaved ADCs; and a full-scale reference generation circuit that includes an analog circuit, where the analog circuit generates full-scale reference voltages of full scales of each ADC in the set of interleaved ADCs.

Moreover, the analog circuit may include full-scale reference generator circuits that generate the full-scale reference voltages for corresponding ADCs of the set of interleaved ADCs, where the full-scale reference generator circuits include open-loop buffers.

Furthermore, the full-scale reference generation circuit may include digital-to-analog converters (DACs) that provide variable currents that, at least in part, specify the full-scale reference voltages. Note that the variable currents may correspond to full-scale corrections of the full scales of the set of interleaved ADCs.

Additionally, the integrated circuit may include a calibration circuit. The calibration circuit may determine the full-scale corrections and may provide feedback to the set of interleaved ADCs via the full-scale reference generation circuit.

In some embodiments, the full-scale reference voltages correspond to the variable currents and a fixed current. Moreover, the integrated circuit may include a full-scale reference generator replica circuit that provides the fixed current. Note that the full-scale reference generator replica circuit may be common to or shared by the full-scale reference generator circuit. Alternatively or additionally, the full-scale reference generator replica circuit may include a second open-loop buffer that matches the open-loop buffers in the full-scale reference generator circuits.

Furthermore, a given full-scale reference voltage of a given interleaved ADC may correspond to a sum of a given variable current and the fixed current.

Additionally, the full-scale reference voltages may be bipolar. For example, a given full-scale reference voltage may include a first voltage and a second voltage that jointly specify the given full-scale reference voltage. Note that the first voltage may correspond to a given full-scale correction to a given full scale of a given interleaved ADC. In some embodiments, the second voltage is a supply voltage of the integrated circuit.

Moreover, the full-scale reference voltages may be independently or separately generated by the full-scale reference generation circuit.

Another embodiment provides a full-scale reference generation circuit.

Another embodiment provides a calibration engine for use in conjunction with the full-scale reference generation circuit.

Another embodiment provides an electronic device that includes the integrated circuit.

Another embodiment provides a system that includes the set of ADCs and the full-scale reference generation circuit.

Another embodiment provides a method for generating full-scale reference voltages. This method includes at least some of the operations performed by the integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

Figure 1:
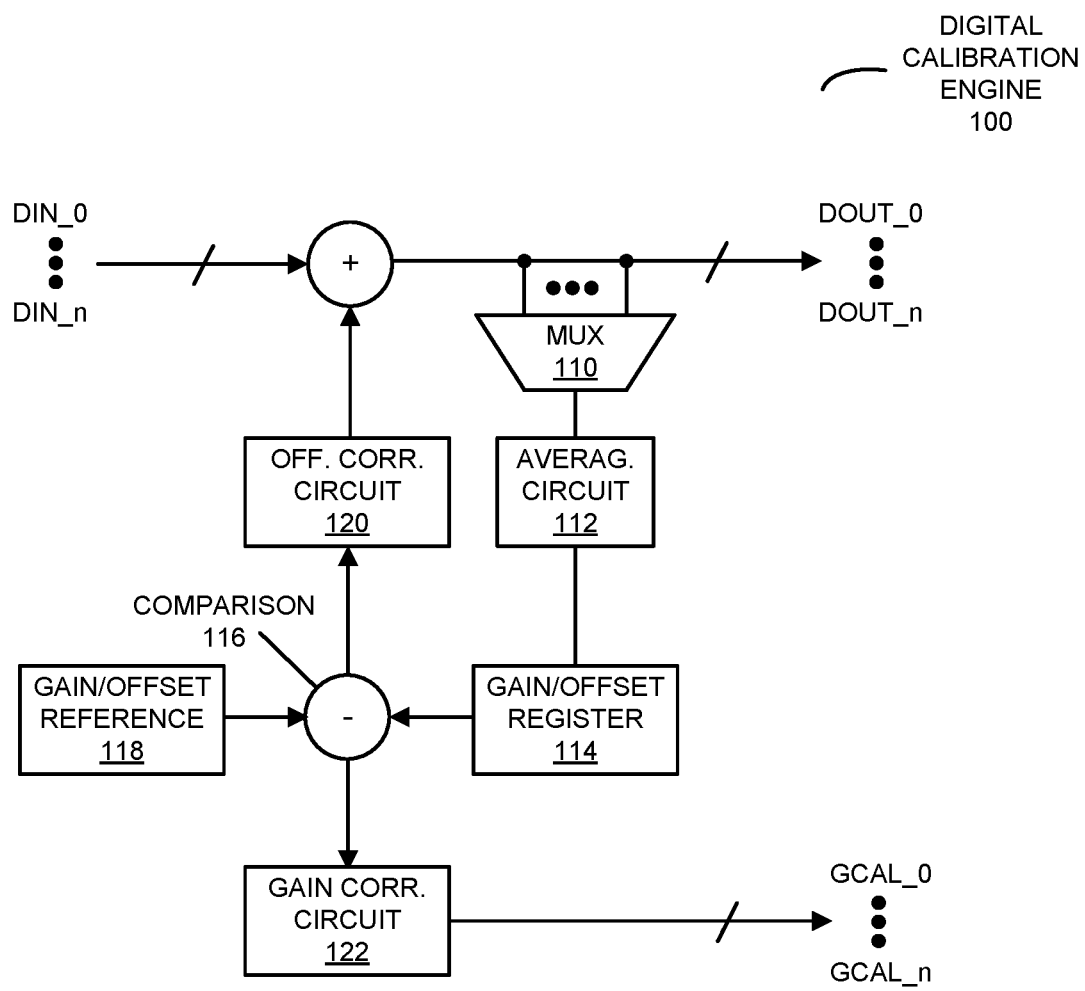
FIG. 1 is a block diagram illustrating an example of a digital calibration engine according to some embodiments of the present disclosure.

An integrated circuit is described. This integrated circuit may include a full-scale reference generation circuit that corrects for variation in the gain or full scale of a set of interleaved ADCs. Notably, the full-scale reference generation circuit may provide a given full-scale or reference setting for a given interleaved ADC, where the given full-scale setting corresponds to a predefined or fixed component and a variable component (which, at least in part, specifies a given full-scale correction for a given full scale of a given interleaved ADC). For example, the full-scale reference generation circuit may include a full-scale reference generator replica circuit that outputs a fixed current corresponding to the fixed component. Furthermore, the full-scale reference generation circuit may include a full-scale reference generator circuit that outputs a first voltage corresponding to the given full-scale setting based at least in part on the fixed current and a variable current that, at least in part, specifies the given full-scale correction. Note that the full-scale reference generator replica circuit and the full-scale reference generator circuit may include matched (open-loop) buffers. Furthermore, the first voltage may be a first voltage that is provided to the given interleaved ADC, and the full-scale reference generator circuit may also provide a second voltage, which is positive and may be a supply voltage, to the given interleaved ADC. The first and the second voltages may specify the given full-scale setting of the given interleaved ADC. However, in other unipolar embodiments, the first voltage may be a lower voltage and the second voltage may be an upper voltage, such as 0.4 V and 0.9 V.

By correcting for variation in the gain or full scale of the set of interleaved ADCs, these circuit techniques may reduce the impact of random transistor mismatch and gradient errors (and, more generally, process, voltage and/or temperature variations) on the set of interleaved ADCs. Notably, the circuit techniques may improve the matching of the gain or full-scale voltages across the set of interleaved ADCs. Moreover, the circuit techniques may not amplify noise. Consequently, the circuit techniques may improve the performance of the set of interleaved ADCs. One or more of these capabilities may allow the embodiments of the set of interleaved ADCs to be used in a wide variety of systems, electronic devices and applications.

In the present disclosure, note that 'full-scale' is sometimes referred to as 'gain.' Full scale may provide or specify the quantized output level based on an analog input level.

We now describe embodiments of the circuit techniques and the set of interleaved ADCs that address these problems. In some embodiments, a calibration engine may determine full-scale corrections and DC offsets for a set of interleaved ADCs (such as SAR ADCs). Notably, the calibration engine may select quantized outputs or representations of an input signal from a given interleaved ADC. Then, the calibration engine may determine or sense an average of the quantized outputs (such as a moving average of an absolute value of differential quantized outputs) and may compare the average to a reference (such as an output of one of the interleaved ADCs, which is used as a reference channel, or a reference signal level) in order to determine a given full-scale correction and a given DC offset for the given interleaved ADC. For example, the given full-scale correction may be determined using least-mean-squares adjustment.

An output from the given interleaved ADC may be corrected for the given DC offset (e.g., the given DC offset may be subtracted from the output). Moreover, the full-scale corrections (such as digital correction coefficients) for the set of interleaved ADCs may be provided to a full-scale reference generation circuit for the set of interleaved ADCs.

The full-scale reference generation circuit may separately or independently adjust full-scale reference voltages for each of the ADCs in the set of interleaved ADCs. For example, the full-scale reference generation circuit may include analog current-steering DACs that partially adjust the full-scale reference voltages. (Therefore, at least a portion of the full-scale reference generation circuit may be implemented in the analog domain.) Notably, the full-scale reference generation circuit may convert a given full-scale correction into a corresponding variable current. This variable current may be combined (e.g., summed) with a fixed current that is provided by a full-scale reference generator replica circuit in the full-scale reference generation circuit (which is sometimes referred to as an 'analog replica feedback circuit').

Then, a full-scale reference generator circuit in the full-scale reference generation circuit may convert the combination of the variable current and the fixed current into a first voltage that corresponds to (e.g., it may, at least in part, specify) a given full-scale reference voltage of the given interleaved ADC. For example, the combination of the variable current and the fixed current may be applied to a resistor, such as a matched resistor. Note that, while the preceding discussion illustrated the calibration technique using the combination of the variable current and the fixed current, in other embodiments the combination of a variable voltage and a fixed voltage may be used.

In some embodiments, the full-scale reference generator replica circuit is shared in the full-scale reference generation circuit by the set of interleaved ADCs. Notably, the fixed component in the full-scale reference voltages for the set of interleaved ADCs may be provided by a common full-scale reference generator replica circuit. Thus, the full-scale reference generator replica circuit may equally distribute the fixed current to full-scale reference generator circuits in the full-scale reference generation circuit. However, the variable components of the full-scale reference voltages may be uniquely generated or provided by the full-scale reference generator circuits based at least in part on the full-scale corrections from the calibration engine. Alternatively, in other embodiments, separate full-scale reference generator replica circuits may provide fixed currents (or fixed components) to the corresponding full-scale reference generator circuits.

Moreover, the full-scale reference generator replica circuit may use feedback (or may be closed-loop) to improve accuracy. However, because this may slow the circuit response, in other embodiments the full-scale reference generator replica circuit may be open-loop. Notably, the full-scale reference generator replica circuit and at least one of the full-scale reference generator circuits may include matched open-loop buffers, such as open-loop source-follower circuits. Note that open-loop buffers may have faster response and may be more power efficient, at the cost of more errors. These errors (as well as other errors in the full-scale reference generation circuit) may be corrected as part of a calibration (such as a digital calibration) that is performed by the calibration circuit, which provides a feedback loop. In addition, note that the use of separate buffers in the full-scale reference generator replica circuit and the full-scale reference generator circuits may reduce crosstalk.

Furthermore, as discussed previously, the fixed component (such as the fixed current) may be provided by a replica of the open-loop buffer in the full-scale reference generator replica circuit. Notably, the full-scale reference generator replica circuit may include the same open-loop buffer as at least one of the full-scale reference generator circuits, which may allow tracking of process, voltage and/or temperature variations.

Additionally, in some embodiments, the full-scale reference voltages may be differential. For example, a capacitor in a DAC in a given interleaved ADC may switch between first and second reference voltages. Consequently, in addition to the first voltage, a given full-scale reference generator circuit may provide a second voltage, which jointly specify a given full-scale reference voltage or setting of the given interleaved ADC. In some embodiments, the first voltage may be the negative voltage and the second voltage may be a positive voltage. For example, the positive voltage may be a supply voltage (such as VDD), which may reduce the power consumption, lower the impedance and/or improve the settling time. As discussed previously, in some embodiments the negative voltage may be buffered and adjustable. However, in other unipolar embodiments, the first voltage is a lower voltage and the second voltage is an upper voltage.

While the preceding discussion illustrated the calibration technique with a set of interleaved ADCs, in other embodiments the calibration technique may be used with another type of ADC implementation, such as a set of interleaved pipelined ADCs or a set of interleaved successive-approximation ADCs.

FIG. 1 presents a block diagram illustrating an example of a digital calibration engine 100 according to some embodiments of the present disclosure. This digital calibration engine may receive quantized representations or outputs DIN_0 . . . DIN_n of analog input signals from a set of interleaved ADCs. Moreover, digital calibration engine 100 may output the corresponding quantized representations DOUT_0 DOUT_n.

Moreover, during operation, digital calibration engine 100 may determine full-scale corrections and DC offsets for the set of interleaved ADCs. Notably, digital calibration engine 100 may select quantized representations (such as DIN_0) from a given interleaved ADC using a multiplexer (MUX) 110. Then, an averaging circuit 112 in digital calibration engine 100 may determine an average of the selected quantized representations (such as a moving average as a function of time). The average value may be stored in a gain/offset register 114. Then, the average value may be compared 116 with a reference voltage (which may be common to the set of interleaved ADCs or may be specific to a particular data channel for, e.g., interleaved ADC_0) provided by a gain/offset reference 118. For example, the reference voltage may be subtracted from the average value. Using this comparison, a full-scale reference generation circuit may determine a given full-scale correction of the given interleaved ADC and an offset correction circuit 120 may determine a given DC offset of the given interleaved ADC.

Next, the quantized representations from the interleaved ADCs may be corrected for the determined DC offsets. For example, the offset correction circuit may subtract the DC offsets from the quantized representations. Moreover, the full-scale corrections or codes GCAL_0-GCAL_n determined by gain correction circuit 122 may be provided to a full-scale reference generation circuit. Note that the full-scale corrections may make the full scales of the set of interleaved ADCs match each other.

Figure 2:
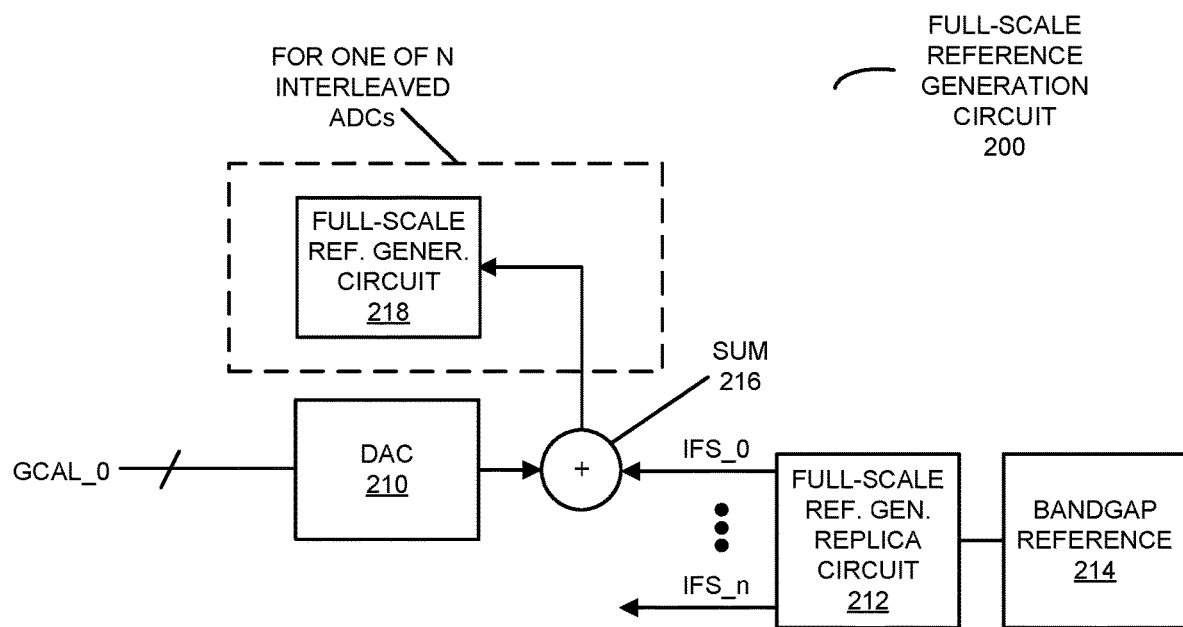
FIG. 2 is a block diagram illustrating an example of a full-scale reference generation circuit according to some embodiments of the present disclosure.

FIG. 2 presents a block diagram illustrating an example of a full-scale reference generation circuit 200 according to some embodiments of the present disclosure. This full-scale reference generation circuit may separately or independently adjust full-scale reference voltages for each of the ADCs in the set of interleaved ADCs. For simplicity, FIG. 2 illustrates generation of a full-scale reference for a given interleaved ADC, such as interleaved ADC 0.

During operation, full-scale reference generation circuit 200 may receive the full-scale correction GCAL_0 from digital calibration engine 100 (FIG. 1). Then, a DAC 210 in full-scale reference generation circuit 200 may convert the full-scale correction into a variable analog current. Moreover, a full-scale reference generator replica circuit 212 in full-scale reference generation circuit 200 may generate fixed currents IFS_0 . . . IFS_n based at least in part on a bandgap reference 214, which may be used to provide the full-scale reference voltages for the set of interleaved ADCs.

Next, full-scale reference generation circuit 200 sums 216 the variable current and the fixed current. Furthermore, a full-scale reference generator circuit 218 in full-scale reference generation circuit 200 may convert the summation of the variable current and the fixed current into a first voltage that corresponds to (e.g., it may, at least in part, specify) a full-scale reference voltage of the interleaved ADC_0.

Note that, in some embodiments, full-scale reference generator replica circuit 212 is shared in full-scale reference generation circuit 200 by the set of interleaved ADCs. Notably, the fixed currents IFS_0 . . . IFS_n for the set of interleaved ADCs may be provided by a common full-scale reference generator replica circuit. Thus, full-scale reference generator replica circuit 212 may equally distribute the fixed current to full-scale reference generator circuits in full-scale reference generation circuit 200. However, as described previously, the variable currents of the full-scale reference voltages may be uniquely generated or provided by the full-scale reference generator circuit based at least in part on the full-scale corrections GCAL_0-GCAL_n from digital calibration engine 100 (FIG. 1).

Figure 3:
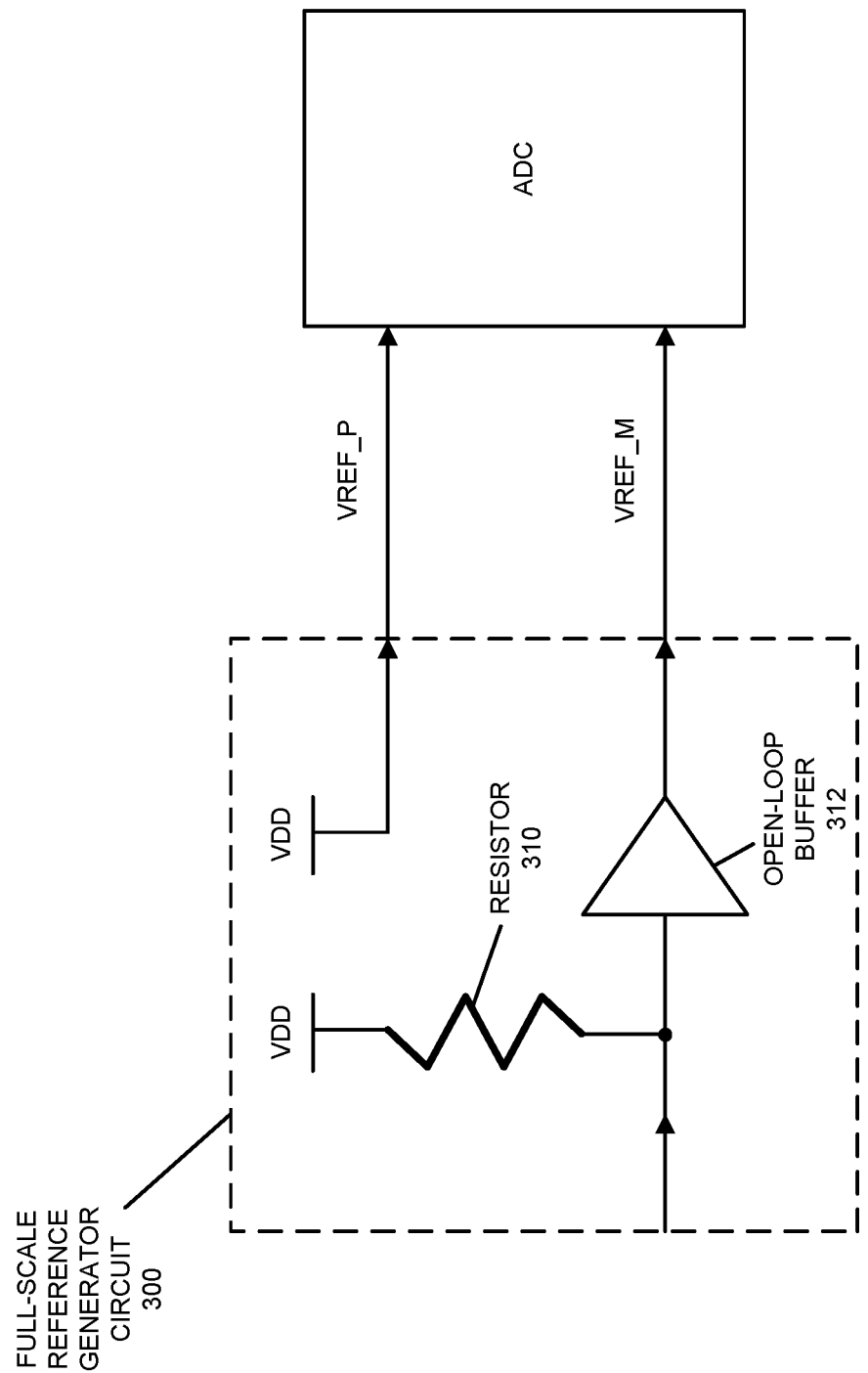
FIG. 3 is a block diagram illustrating an example of a full-scale reference generator circuit according to some embodiments of the present disclosure.

FIG. 3 presents a block diagram illustrating an example of a full-scale reference generator circuit 300 according to some embodiments of the present disclosure. Notably, full-scale reference generation circuit 300 may apply the summation of the variable current and the fixed current to a resistor 310, such as a matched resistor. Then, a matched open-loop buffer 312, such as an open-loop source follower, may provide a first voltage VREF_M to an interleaved ADC, such as the interleaved ADC 0 (which may be separate from, and thus not included in, full-scale reference generator circuit 300). As discussed previously, open-loop buffer 312 may have faster response and may be more power efficient, at the cost of more errors. These errors (as well as other errors in full-scale reference generation circuit 200 in FIG. 2) may be corrected as part of a calibration that is performed by digital calibration circuit 100 (FIG. 1), which provides a feedback loop.

In some embodiments, the full-scale reference voltages may be differential. For example, the first voltage may be a negative voltage. Moreover, full-scale reference generator circuit 200 (FIG. 2) may provide a second voltage VREF_P, which, in conjunction with the first voltage, jointly specifies the full-scale reference voltage of the interleaved ADC 0. This second voltage may be a positive voltage, such as a supply voltage (such as VDD), which may reduce the power consumption, lower the impedance and/or improve the settling time. Alternatively, in some embodiments, the second voltage, which is a positive voltage, may be a variable voltage that corresponds to the full-scale correction, and the first voltage may be ground. In other unipolar embodiments, the first voltage is a lower voltage and the second voltage is an upper voltage.

Figure 4:
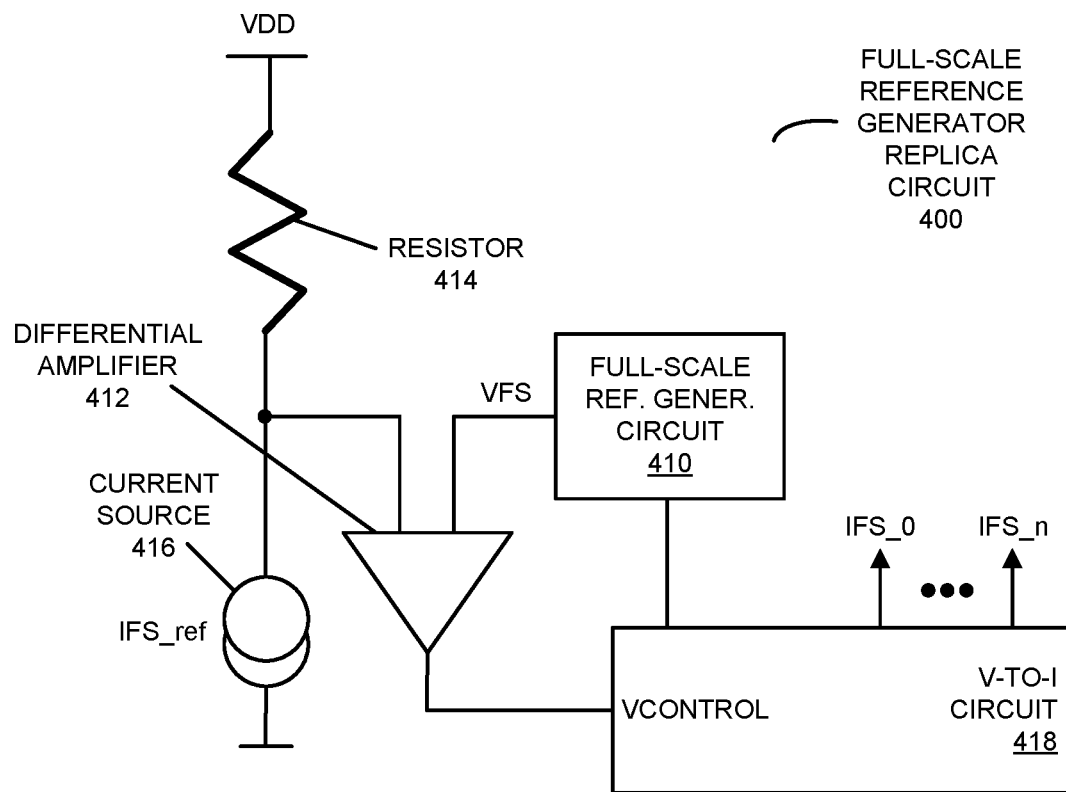
FIG. 4 is a block diagram illustrating an example of a full-scale reference generator replica circuit according to some embodiments of the present disclosure.

FIG. 4 presents a block diagram illustrating an example of a full-scale reference generator replica circuit 400 according to some embodiments of the present disclosure. This full-scale reference generator replica circuit may provide a fixed current using a replica (e.g., an exact match) of the open-loop buffer in full-scale reference generator circuit 300 (FIG. 3). This may allow tracking of process, voltage and/or temperature variations by full-scale reference generator replica circuit 400 and full-scale reference generator circuit 300 (FIG. 3).

Notably, during operation, an instance of full-scale reference generator circuit 410 in full-scale reference generator replica circuit 400 may provide a full-scale reference voltage VFS, which is compared by a differential amplifier 412 to a voltage provided by a resistor 414 and a current IFS_ref from a current source 416 (which provides a master reference). The resulting error may be provided to a voltage-to-current (V-to-I) circuit 418, which uses it to provide the fixed currents IFS_0 ... IFS_n to the set of interleaved ADCs. For example, the error may be applied to the gate of a current mirror, which provides exact copies of the fixed currents to the set of interleaved ADCs. In addition, the current mirror in the V-to-I circuit 418 may provide a copy of the fixed current to the instance of full-scale reference generator circuit 410.

In the present discussion, the interleaved analog-to-digital conversion performed by the set of interleaved ADCs may be applied to a wide variety of input signals. For example, an input signal may include a frame. This frame may include an image, where the different ADCs in the set of interleaved ADCs receive analog inputs corresponding to different spatial locations or regions. Alternatively, in some embodiments, such as in a scanning system, a frame may be progressively captured over a time interval (such as several milliseconds). Thus, in these embodiments, the set of interleaved ADCs may receive analog inputs corresponding to different spatial locations or regions that are captured at different times.

Figure 5:
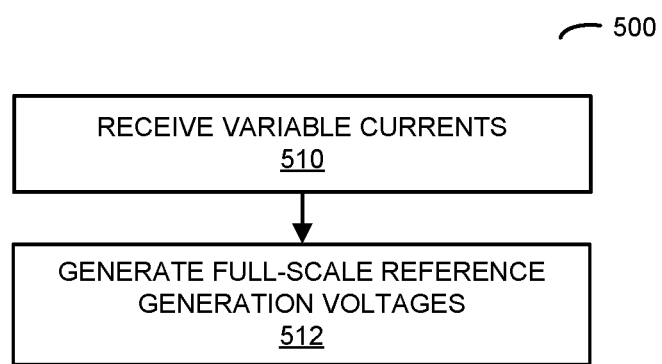
FIG. 5 is a flow diagram illustrating an example of a method for generating full-scale reference voltages according to some embodiments of the present disclosure.

We now describe embodiments of a method. FIG. 5 presents a flow diagram illustrating an example of a method 500 for generating full-scale reference voltages using a full-scale reference generation circuit, such as full-scale reference generating circuit 200 (FIG. 2). During operation, the full-scale reference generation circuit may receive, from DACs, variable currents (operation 510) that, at least in part, specify the full-scale reference voltages. Moreover, an analog circuit in the full-scale reference generation circuit generates, based at least in part on the variable currents, the full-scale reference voltages (operation 512) of full scales of each analog-to-digital converter (ADC) in a set of interleaved ADCs, where the variable currents correspond to full-scale corrections of the full scales of the set of interleaved ADCs.

In some embodiments of the method 500, there may be additional or fewer operations. Moreover, the order of the operations may be changed, and/or two or more operations may be combined into a single operation.

The disclosed ADCs and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the full-scale reference generation circuit, the integrated circuit that includes the full-scale reference generation circuit, and the set of interleaved ADCs, in alternative embodiments, different components and/or subsystems may be present in the calibration engine, the full-scale reference generation circuit, the integrated circuit that includes the full-scale reference generation circuit, and/or the set of interleaved ADCs. Thus, the embodiments of the calibration engine, the full-scale reference generation circuit, the integrated circuit that includes the full-scale reference generation circuit, and/or the set of interleaved ADCs may include fewer components, additional components, different components, two or more components may be combined into a single component, a single component may be separated into two or more components, one or more positions of one or more components may be changed, and/or there may be different types of components.

Moreover, the circuits and components in the embodiments of the calibration engine, the full-scale reference generation circuit, the integrated circuit that includes the full-scale reference generation circuit, and/or the set of interleaved ADCs may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
    a set of analog-to-digital converters (ADCs) configured to provide quantized outputs corresponding to an input signal; and
    a calibration engine, coupled to the set of ADCs, configured to provide full-scale reference corrections and DC offsets to the set of ADCs, wherein the calibration engine is configured to:
        compute an average of the quantized outputs; and
        determine, for a given ADC in the set of ADCs, a given full-scale reference correction in the full-scale reference corrections and a given DC offset in the DC offsets by comparing the average of the quantized outputs and a reference; and
    wherein the calibration engine comprises:
        full-scale reference generation circuits configured to generate full-scale reference voltages of full scales of each ADC in the set of ADCs, wherein the full-scale reference voltages correspond to variable components and a fixed component; and wherein the variable components correspond to the full-scale corrections of the full scales of the set of ADCs; and
        a full-scale reference generator replica circuit configured to provide the fixed component, wherein the full-scale reference generator replica circuit is open-loop.

2. The integrated circuit of claim 1, wherein the integrated circuit is configured to correct a given quantized output from the given ADC for the given DC offset.

3. The integrated circuit of claim 1, wherein the reference comprises a quantized output of one ADC in the set of ADCs.

4. The integrated circuit of claim 1, wherein the full-scale reference generation circuits comprise analog circuits.

5. The integrated circuit of claim 1, wherein the full-scale reference generator replica circuit is common to or shared by the full-scale reference generation circuits.

6. The integrated circuit of claim 1, wherein the variable components correspond to voltages or currents.

7. The integrated circuit of claim 1, wherein the fixed component corresponds to a voltage or a current.

8. The integrated circuit of claim 1, wherein the full-scale reference generator replica circuit and at least one of the full-scale reference generation circuits comprise matched open-loop buffers.

9. The integrated circuit of claim 1, wherein the set of ADCs comprise: a set of interleaved ADCs, a set of interleaved pipelined ADCs or a set of interleaved successive-approximation ADCs.

10. The integrated circuit of claim 1, wherein a given full-scale reference voltage of the given ADC corresponds to a sum of a given variable component in the variable components and the fixed component.

11. The integrated circuit of claim 1, wherein the full-scale reference voltages are bipolar.

12. The integrated circuit of claim 11, wherein a given full-scale reference voltage in the full-scale reference voltages comprise a first voltage and a second voltage that jointly specify the given full-scale reference voltage.

13. The integrated circuit of claim 12, wherein the first voltage corresponds to a given full-scale correction to a given full scale of the given ADC.

14. The integrated circuit of claim 12, wherein the second voltage is a supply voltage of the integrated circuit.

15. The integrated circuit of claim 1, wherein the full-scale reference voltages are independently or separately generated by the full-scale reference generation circuits.

16. A system, comprising:
    a set of analog-to-digital converters (ADCs) configured to provide quantized outputs corresponding to an input signal; and
    a calibration engine, coupled to the set of ADCs, configured to provide full-scale reference corrections and DC offsets to the set of ADCs, wherein the calibration engine is configured to:
        compute an average of the quantized outputs; and determine, for a given ADC in the set of ADCs, a given full-scale reference correction in the full-scale reference corrections and a given DC offset in the DC offsets by comparing the average of the quantized outputs and a reference; and wherein the calibration engine comprises:
full-scale reference generation circuits configured to generate full-scale reference voltages of full scales of each ADC in the set of ADCs, wherein the full-scale reference voltages correspond to variable components and a fixed component; and wherein the variable components correspond to the full-scale corrections of the full scales of the set of ADCs; and a full-scale reference generator replica circuit configured to provide the fixed component, wherein the full-scale reference generator replica circuit is open-loop.

17. The system of claim 16, wherein the full-scale reference generator replica circuit and at least one of the full-scale reference generation circuits comprise matched open-loop buffers.

18. A method for generating full-scale reference voltages, comprising:
by a system:
receiving an input signal;
providing, using a set of analog-to-digital converters (ADCs), quantized outputs corresponding to the input signal; and
providing, using a calibration engine, full-scale reference corrections and DC offsets to the set of ADCs by performing operations comprising:
computing an average of the quantized outputs;
determining, for a given ADC in the set of ADCs, a given full-scale reference correction in the full-scale reference corrections and a given DC offset in the DC offsets by comparing the average of the quantized outputs and a reference;
generating, using full-scale reference generation circuits, the full-scale reference voltages of full scales of each ADC in the set of ADCs, wherein the full-scale reference voltages correspond to variable components and a fixed component; and wherein the variable components correspond to the full-scale corrections of the full scales of the set of ADCs; and
providing, using a full-scale reference generator replica circuit, the fixed component, wherein the full-scale reference generator replica circuit is open-loop.

19. The method of claim 18, wherein the full-scale reference generator replica circuit and at least one of the full-scale reference generation circuits comprise matched open-loop buffers.

20. The method of claim 18, wherein the reference comprises a quantized output of one ADC in the set of ADCs.

* * * * *